United States Patent
Zhou et al.

(10) Patent No.: US 10,772,226 B2
(45) Date of Patent: Sep. 8, 2020

(54) WATERPROOF COVER

(71) Applicant: Otis Elevator Company, Farmington, CT (US)

(72) Inventors: Shizhong Zhou, Shanghai (CN); Gang Xing, Shanghai (CN); LongWen Wang, Shanghai (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 248 days.

(21) Appl. No.: 15/937,055

(22) Filed: Mar. 27, 2018

(65) Prior Publication Data

US 2019/0307006 A1   Oct. 3, 2019

(51) Int. Cl.
| | |
|---|---|
| *H05K 5/03* | (2006.01) |
| *B01D 46/00* | (2006.01) |
| *H05K 5/02* | (2006.01) |

(52) U.S. Cl.
CPC ............ *H05K 5/03* (2013.01); *B01D 46/0043* (2013.01); *H05K 5/0213* (2013.01); *H05K 5/0217* (2013.01); *B01D 2279/45* (2013.01)

(58) Field of Classification Search
CPC .. B01D 46/0043; B01D 2279/45; H05K 5/03; H05K 5/0213; H05K 5/0217; H05K 5/0239; H05K 5/069
USPC .... 55/385.1, 385.6; 135/119, 132, 147, 148, 135/152, 153; 52/63, 65; 361/690, 692, 361/694, 695
See application file for complete search history.

(56) References Cited

U.S. PATENT DOCUMENTS

| | | | |
|---|---|---|---|
| 6,133,531 | A  | 10/2000 | Hayduke et al. |
| 6,643,130 | B1 | 11/2003 | Demarchis et al. |
| 6,979,777 | B2 | 12/2005 | Marcou et al. |
| 7,312,993 | B2 | 12/2007 | Bundza et al. |
| 7,396,997 | B2 |  7/2008 | Dinh |
| 7,782,597 | B2 |  8/2010 | Chiu |
| 8,432,685 | B2 |  4/2013 | Huang et al. |

(Continued)

FOREIGN PATENT DOCUMENTS

| | | |
|---|---|---|
| CN | 200973206 Y | 11/2007 |
| CN | 201156845 Y | 11/2008 |

(Continued)

OTHER PUBLICATIONS

Anonymous, "M Traffic Signal Cabinets", URL:<https://www.bisonprofab.com/m-cabinets.htm>, Online downloaded Mar. 27, 2018, 2 pages.

(Continued)

*Primary Examiner* — Minh Chau T Pham
(74) *Attorney, Agent, or Firm* — Cantor Colburn LLP

(57) ABSTRACT

An additional cover provides a cabinet with protection from fluidic ingress. The additional cover includes first and second portions having first and second main sections, respectively, and first and second flanges, respectively, and first and second sidewalls extending between corresponding sidelong edges of at least the first and second main sections. The first and second portions and the first and second sidewalls are arranged to define a flow passage with an inlet at an upper end thereof and an outlet at a lower end thereof. The first and second flanges are provided at the inlet and outlet, respectively, to prevent fluid flow through the flow passage.

15 Claims, 2 Drawing Sheets

(56) References Cited

U.S. PATENT DOCUMENTS

| | | | |
|---|---|---|---|
| 9,048,645 B1 | 6/2015 | Gretz | |
| 9,198,306 B1* | 11/2015 | Feinstein | G09B 19/0046 |
| 9,668,369 B2* | 5/2017 | Cox | H05K 5/0217 |
| 2011/0182036 A1* | 7/2011 | Huang | H05K 7/20009 |
| | | | 361/724 |
| 2012/0099276 A1* | 4/2012 | Lin | H05K 5/0213 |
| | | | 361/692 |
| 2012/0174786 A1* | 7/2012 | Sahley | B01D 46/0086 |
| | | | 95/278 |
| 2012/0298330 A1 | 11/2012 | Mysse, III | |
| 2013/0201685 A1* | 8/2013 | Messmore | H05K 7/20972 |
| | | | 362/249.01 |
| 2016/0105995 A1 | 4/2016 | Falk | |
| 2016/0215999 A1 | 7/2016 | Barb et al. | |
| 2018/0151062 A1* | 5/2018 | Takagi | G08G 1/07 |
| 2018/0249595 A1* | 8/2018 | Ashbaugh | H05K 5/0213 |
| 2018/0255654 A1* | 9/2018 | Joo | G06F 1/183 |

FOREIGN PATENT DOCUMENTS

| | | |
|---|---|---|
| CN | 201556646 U | 8/2010 |
| CN | 201967265 U | 9/2011 |
| CN | 203289779 U | 11/2013 |
| CN | 103635067 A | 3/2014 |
| CN | 203661466 U | 6/2014 |
| CN | 106304803 A | 1/2017 |
| CN | 103732024 B | 4/2017 |
| CN | 106785964 A | 5/2017 |
| JP | 2004063598 A | 2/2004 |
| JP | 2015065335 A | 4/2015 |
| KR | 101204110 B1 | 11/2012 |
| TW | 201218912 A | 5/2012 |

OTHER PUBLICATIONS

Search Report dated Jul. 31, 2019 in U321135EP, 35 pages.

* cited by examiner

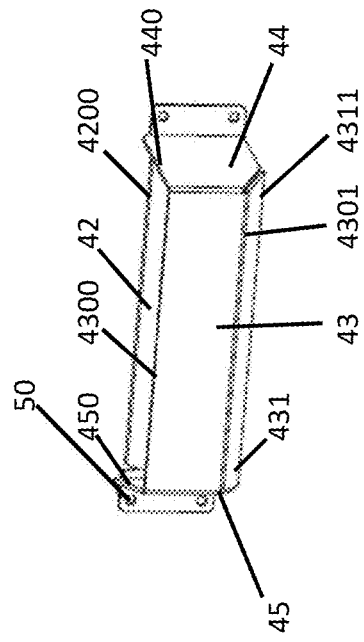
FIG. 6
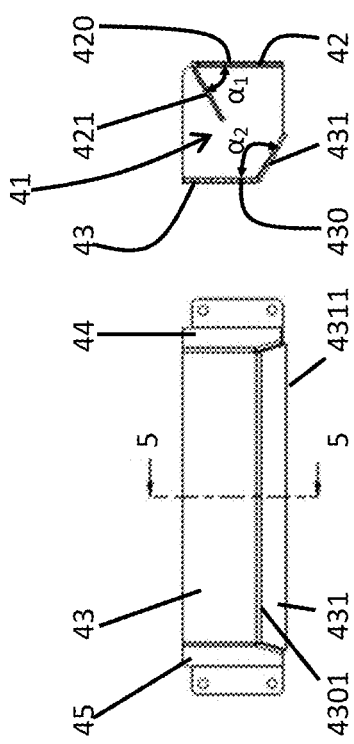
FIG. 4
FIG. 5
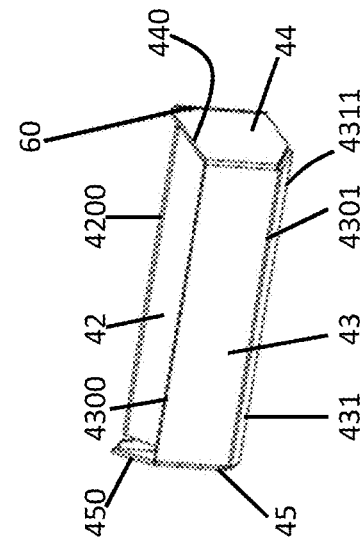
FIG. 9
FIG. 8
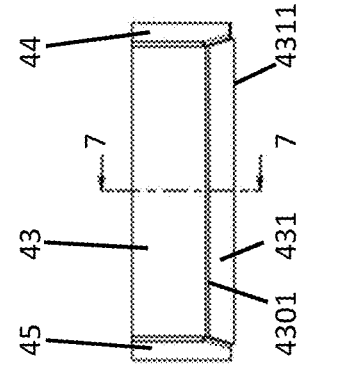
FIG. 7

WATERPROOF COVER

BACKGROUND

The following description relates to waterproof covers and, more specifically, to a waterproof cover for an electrical cabinet that meets NEMA4 standard requirements.

The National Electrical Manufacturers Association (NEMA) is a US manufacturing organization which actively promotes standardized product specifications for electrical apparatuses. While NEMA does not actually test products, it establishes the performance criteria for enclosures intended for specific environments. NEMA standards describe each type of enclosure in general and functional terms and specifically omits reference to construction details. In other words, NEMA specifies what an enclosure must do, not how to manufacture it. As an example, NEMA4 enclosures are used in many applications where an occasional washdown occurs or where machine tool cutter coolant is used. They also serve in applications where a pressurized stream of water will be used. NEMA4 enclosures are gasketed and the door is clamped for maximum sealing.

Electrical cabinets might be able to meet certain requirements but cannot NEMA4 satisfy NEA4 requirements if they are unable to prevent water ingress from spraying. This is particularly true for covers of IP55 fan filters. The covers often lack lower filtering assemblies and thus allow for the ingress of water that is sprayed onto the covers.

BRIEF DESCRIPTION

According to an aspect of the disclosure, an additional cover provides a cabinet with protection from fluidic ingress. The additional cover includes first and second portions having first and second main sections, respectively, and first and second flanges, respectively, and first and second sidewalls extending between corresponding sidelong edges of at least the first and second main sections. The first and second portions and the first and second sidewalls are arranged to define a flow passage with an inlet at an upper end thereof and an outlet at a lower end thereof. The first and second flanges are provided at the inlet and outlet, respectively, to prevent fluid flow through the flow passage.

In accordance with additional or alternative embodiments, respective upper edges of the first and second portions and the first and second sidewalls are registerable with a lower end of a frame cover defining an upper passage leading to the inlet of the flow passage.

In accordance with additional or alternative embodiments, the respective upper edges are formed to encompass the lower end of the frame cover.

In accordance with additional or alternative embodiments, respective upper edges of the first and second portions and the first and second sidewalls form the inlet, and the first flange extends from the upper edge of the first portion and forms an acute angle with the first portion at the inlet.

In accordance with additional or alternative embodiments, a lower edge of the second portion terminates above a lower edge of the first portion, the second flange extends from the lower edge of the second portion and forms an obtuse angle with the second portion above the outlet and respective lower edges of the first portion, the second flange and the first and second sidewalls form the outlet.

In accordance with additional or alternative embodiments, respective interior edges of the first and second flanges do not overlap across the flow passage.

In accordance with additional or alternative embodiments, the first and second sidewalls taper inwardly while extending from the first portion to the second portion.

In accordance with additional or alternative embodiments, the additional cover further includes at least one of a mounting surface and a weld coupled to the first portion.

According to yet another aspect of the disclosure, an electric cabinet is provided. The electric cabinet includes an exterior wall defining an opening, a frame cover disposed about the opening to define an upper passage and to direct fluid flow moving through the opening downward through the upper passage and an additional cover. The additional cover is attachable to a lower end of the frame cover to provide the electric cabinet with protection against fluidic ingress from an exterior of the frame cover and the additional cover, through an interior of the additional cover and into an interior of the frame cover.

In accordance with additional or alternative embodiments, filter media are disposable in the opening.

In accordance with additional or alternative embodiments, the additional cover includes first and second portions having first and second main sections, respectively, and first and second flanges, respectively, and first and second sidewalls extending between corresponding sidelong edges of at least the first and second main sections, the first and second portions and the first and second sidewalls being arranged to define a flow passage with an inlet fluidly communicative with the upper passage at an upper end thereof and an outlet at a lower end thereof, and the first and second flanges being provided at the inlet and outlet, respectively, to prevent fluid flow through the flow passage.

In accordance with additional or alternative embodiments, respective upper edges of the first and second portions and the first and second sidewalls are registerable with the lower end of the frame cover.

In accordance with additional or alternative embodiments, the respective upper edges are formed to encompass the lower end of the frame cover.

In accordance with additional or alternative embodiments, respective upper edges of the first and second portions and the first and second sidewalls form the inlet, and the first flange extends from the upper edge of the first portion and forms an acute angle with the first portion at the inlet.

In accordance with additional or alternative embodiments, a lower edge of the second portion terminates above a lower edge of the first portion, the second flange extends from the lower edge of the second portion and forms an obtuse angle with the second portion above the outlet, and respective lower edges of the first portion, the second flange and the first and second sidewalls form the outlet.

In accordance with additional or alternative embodiments, respective interior edges of the first and second flanges do not overlap across the flow passage.

In accordance with additional or alternative embodiments, the first and second sidewalls taper inwardly while extending from the first portion to the second portion.

In accordance with additional or alternative embodiments, the electric cabinet further includes at least one of a mounting surface and a weld coupled to the first portion by which the additional cover is affixable to the exterior wall.

According to yet another aspect of the disclosure, an electric cabinet is provided and includes an exterior wall defining an opening, a frame cover disposed about the opening to define an upper passage and to direct fluid flow moving through the opening downward through the upper passage and an additional cover for providing at least one of NEMA4 and IPX6 protection, which is attachable to a lower end of the frame cover. The additional cover is formed to define a flow passage fluidly communicative with the upper passage and is configured to form a tortuous path for fluid propagating from an exterior of the additional cover, through the flow passage and toward the upper passage.

In accordance with additional or alternative embodiments, the electric cabinet further includes filter media disposable in the opening.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features and advantages of the disclosure are apparent from the following detailed description taken in conjunction with the accompanying drawings in which:

FIG. 4 is an elevational view of an additional cover for protection against fluidic ingress in accordance with embodiments;

FIG. 5 is a side view of the additional cover for protection against fluidic ingress of FIG. 4 taken along line 5-5;

FIG. 6 is a perspective view of the additional cover for protection against fluidic ingress of FIGS. 4 and 5;

FIG. 7 is an elevational view of an additional cover for protection against fluidic ingress in accordance with embodiments;

FIG. 8 is a side view of the additional cover for protection against fluidic ingress of FIG. 4 taken along line 7-7; and FIG. 9 is a perspective view of the additional cover for protection against fluidic ingress of FIGS. 7 and 8.

DETAILED DESCRIPTION

As will be described below, an additional cover for a fan filter (e.g., an IP55 fan filter) in particular is provided and offers protection against fluidic ingress and, more particularly, at least one of NEMA4 and/or IPX6 protection. The additional cover is attachable to a frame cover and includes or is provided as an additional metallic cover that has at least two bent wall structures and can be mounted by nut-bolt combinations or by welding.

Figure 3:
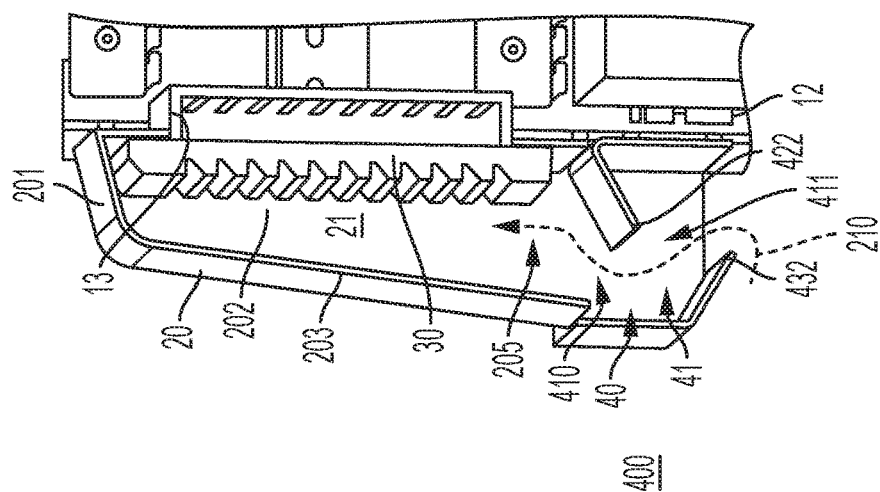
FIG. 3 is a side cutaway view of a frame cover and an additional cover for protection against fluidic ingress in accordance with embodiments.
Figure 2:
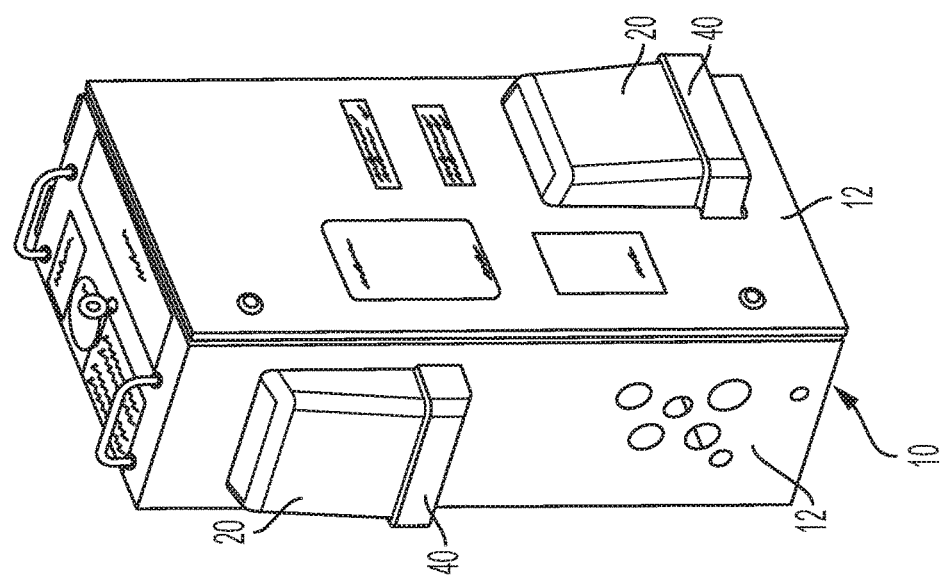
FIG. 2 is a perspective view of an electric cabinet with frame covers and additional covers for protection against fluidic ingress in accordance with embodiments.
Figure 1:
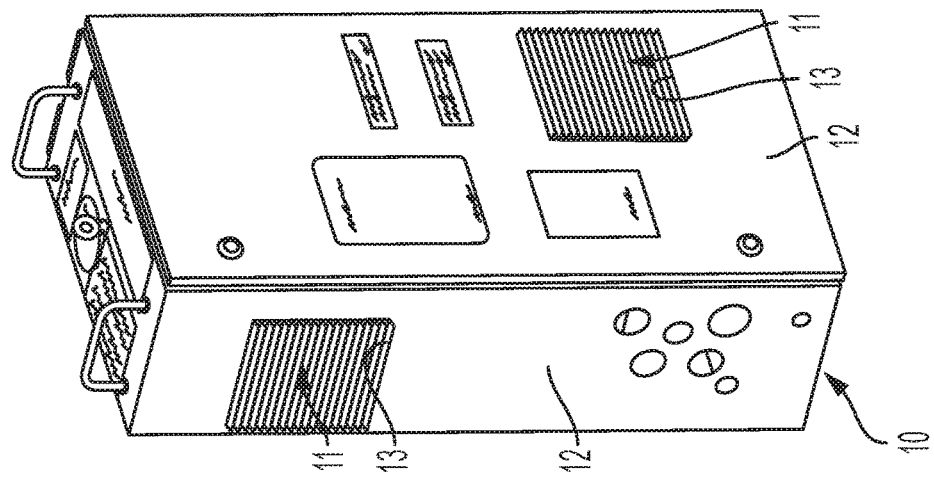
FIG. 1 is a perspective view of an electric cabinet in accordance with embodiments.

With reference to FIGS. 1-3, an electric cabinet 10 is provided and may be configured as or with an IP fan filter 11. The electric cabinet 10 includes an exterior wall 12 defining an opening 13 (see FIG. 3). A frame cover 20 is disposed about the opening 13 to define an upper passage 21 and to direct fluid flow moving through the opening 13 in a horizontal direction to be deflected downwardly along and through the upper passage 21. The frame cover 20 includes a ceiling 201, which is disposable above the opening 13, sidewalls 202 extending downwardly from opposite sidelong edges of the ceiling 201 and an end cover portion 203. The end cover portion 203 extends downwardly from an end edge of the ceiling 201 and between distal sidelong edges of the sidewalls 202. The ceiling 201 is angled downwardly with increasing distance from the exterior wall 12 and the sidewalls 202 are tapered inwardly with increasing distance from the exterior wall 12. The sidewalls 202 also have increasing widths (as measured with increasing distance from the exterior wall 12) with increasing downward distance from the ceiling 201 such that the end cover portion 203 is angled outwardly from the exterior wall 12 with increasing downward distance from the ceiling 201.

The ceiling 201, the sidewalls 202 and the end cover portion 203 cooperatively form the upper passage 21 with the exterior wall 12 and define an upper end portion of the frame cover 20 proximate to the ceiling 201 and a lower end portion 205 of the frame cover 20 opposite the upper portion. The lower end portion 205 is generally formed by lower-most edges of the sidewalls 202 and the end cover portion 203 and proximal portions of the exterior wall 12.

As shown in FIG. 1, the exterior wall 12 can be a side or lateral wall of the electric cabinet 10 or a front or back wall of the electric cabinet 10. In any case, filter media 30 may be operably disposed in the opening 13 to filter fluid moving from an interior of the electric cabinet 10, through the opening 13 and toward the upper passage 21.

The electric cabinet 10 further includes an additional cover 40. The additional cover 40 is configured for providing protection against fluidic ingress for the electric cabinet 10 (e.g., at least one of NEMA4 and/or IPX6 protection) and is attachable to the lower end portion 205 of the frame cover 20. That is, the additional cover 40 is formed to define a flow passage 41 which is fluidly communicative with the upper passage 21 and which is configured to form a tortuous path 210 for fluid propagating from an exterior 400 of the additional cover 40, upwardly through the flow passage 41 and toward and into the upper passage 21. In particular, the additional cover 40 is formed and configured to pass at least NEMA4 and IPX6 water spraying tests.

With continued reference to FIG. 3 and with additional reference to FIGS. 4-6 and 7-9, the additional cover 40 includes a first portion 42, a second portion 43, a first sidewall 44 and a second sidewall 45. The second portion 43 is opposite the first portion 42 and the second sidewall 45 is opposite the first sidewall 44. The first portion 42 has a first main section 420 and a first flange 421. The second portion 43 has a second main section 430 and a second flange 431. The first and second sidewalls 44 and 45 respectively extend between corresponding sidelong edges of at least the first and second main sections 420 and 430. The first and second portions 42 and 43 and the first and second sidewalls 44 and 45 are cooperatively arranged to define the flow passage 41 with an inlet 410 and an outlet 411 (see FIG. 3). The inlet 410 is fluidly communicative with the upper passage 21 at an upper end of the flow passage 41 and the outlet 411 is defined at a lower end of the flow passage 41.

In accordance with embodiments, the first and second sidewalls 44 and 45 taper inwardly and toward one another while extending from the first portion 42 to the second portion 43. An angle of the taper of the first and second sidewalls 44 and 45 may be similar to an angle of the taper of the sidewalls 202 of the frame cover 20. In accordance with further embodiments, the first and second main sections 420 and 430 may taper toward one another or may be substantially parallel with one another. In the former case, an angle of the taper may be similar to the outward angle of the end cover portion 203.

The first flange 421 is provided at or near to the inlet 410. The second flange 431 is provided at or near to the outlet 411. Both the first flange 421 and the second flange 431 are formed, defined and angled to prevent or substantially limit fluid flow through the flow passage 41 in satisfaction of the at least NEMA4 and IPX6 requirements especially during the water spraying tests. Respective upper edges 4200 and 4300 of the first main section 420 of the first portion 42 and the second main section 430 of the second portion 43 and respective upper edges 440 and 450 of the first and second sidewalls 44 and 45 are registerable with the lower end portion 205 of the frame cover 20. In accordance with embodiments, interior surfaces of the respective upper edges 4200 and 4300 of the first main section 420 of the first portion 42 and the second main section 430 of the second portion 43 and respective upper edges 440 and 450 of the first and second sidewalls 44 and 45 are registerable with and formed to encompass exterior surfaces of the lower end portion 205 of the frame cover 20.

With the respective upper edges 4200 and 4300 (see FIGS. 6 and 9) of the first and second main sections 420 and 430 of the first and second portions 42 and 43 and the respective upper edges 440 and 450 (see FIGS. 6 and 9) of the first and second sidewalls 44 and 45 registerable with the lower end portion 205 of the frame cover 20, the respective upper edges 4200 and 4300 of the first and second main sections 420 and 430 of the first and second portions 42 and 43 and the respective upper edges 440 and 450 of the first and second sidewalls 44 and 45 effectively form the inlet 410. The first flange 421 extends from the upper edge 4200 of the first main section 420 of the first portion 42 and forms an acute angle $\alpha_1$ (see FIGS. 5 and 7) with the first 42 portion at the inlet 410.

A lower edge 4301 (see FIGS. 4 and 6 and FIGS. 8 and 9) of the second main section 430 of the second portion 43 terminates above a lower edge 4201 (see FIGS. 4 and 6) of the first main section 420 of the first portion 42. The second flange 431 extends from the lower edge 4301 and forms an obtuse angle $\alpha_2$ (see FIGS. 5 and 7) with the second portion 43 above the outlet 411. The respective lower edges 4201, 4311, 441 and 451 of the first main section 420 of the first portion 420, the second flange 431 and the first and second sidewalls 440 and 450 form the outlet 411.

In accordance with embodiments, a distal tip 422 of the first flange 421 and a distal tip 432 of the second flange 431 (see FIG. 3) may but need not overlap with one another within the interior of the frame cover 20. For example, where the distal tips 422 and 432 extend inwardly toward a same plane without overlapping, a fluid, such as water being sprayed onto the frame cover 20 and the additional cover 40 during a NEMA4 or IPX6 test, which moves through the interior of the additional cover 40 and along the tortuous path 210 is required to make multiple turns around the first flange 421 and the second flange 431 even where the distal tips 422 and 432 do not overlap. That is, the fluid moving upwardly along the first portion 42 impinges upon the first flange 421 and is not permitted to proceed into the frame cover 20. Similarly, fluid moving upwardly past the lower edge 4311 of the second flange 431 impinges upon the first flange 421 and is not permitted to proceed into the frame cover 20.

As shown in FIGS. 6 and 9, the additional cover 40 may include at least one of a mounting surface 50 (see FIG. 6) and a weld 60 (see FIG. 9). The mounting surface 50 may be coupled to and extend off of the first portion 42 proximate to the first and second sidewalls 44 and 45 so that the additional cover 40 can be affixable to the exterior wall 12 by for example a nut and bolt combination. The weld 60 may be employed to couple the first portion 42 to the exterior wall 12 proximate to the first and second sidewalls 44 and 45 to thereby affix the additional cover 40 to the exterior wall 12.

Benefits of the features described herein are the provision of an additional cover for a fan filter or another similar electrical cabinet. The additional cover is attachable to a frame cover and includes or is provided as an additional metallic cover that offers protection against fluidic ingress or, more particularly, at least one of NEMA4 and/or IPX6 protection, as evidenced by the additional cover having passed water-spraying tests and can be bolted or welded onto the original cover.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. An additional cover for providing a cabinet with protection from fluidic ingress, the additional cover comprising:

first and second portions having first and second main sections, respectively, and first and second flanges, respectively; and first and second sidewalls extending between corresponding sidelong edges of at least the first and second main sections, the first and second portions and the first and second sidewalls being arranged to define a flow passage with an inlet at an upper end thereof and an outlet at a lower end thereof, the first and second flanges being provided at the inlet and outlet, respectively, to prevent fluid flow through the flow passage, wherein:

respective upper edges of the first and second portions and the first and second sidewalls form the inlet and the first flange extends from the upper edge of the first portion and forms an acute angle with the first portion at the inlet, and a lower edge of the second portion terminates above a lower edge of the first portion, the second flange extends from the lower edge of the second portion and forms an obtuse angle with the second portion above the outlet, and respective lower edges of the first portion, the second flange and the first and second sidewalls form the outlet.

2. The additional cover according to claim 1, wherein respective upper edges of the first and second portions and the first and second sidewalls are registerable with a lower end of a frame cover defining an upper passage leading to the inlet of the flow passage.

3. The additional cover according to claim 2, wherein the respective upper edges are formed to encompass the lower end of the frame cover.

4. The additional cover according to claim 1, wherein respective interior edges of the first and second flanges do not overlap across the flow passage.

5. The additional cover according to claim 1, wherein the first and second sidewalls taper inwardly while extending from the first portion to the second portion.

6. The additional cover according to claim 1, further comprising at least one of a mounting surface and a weld coupled to the first portion.

7. An electric cabinet, comprising:
an exterior wall defining an opening;
a frame cover disposed about the opening to define an upper passage and to direct fluid flow moving through the opening downward through the upper passage; and
an additional cover, which is attachable to a lower end of the frame cover to provide the electric cabinet with protection against fluidic ingress from an exterior of the frame cover and the additional cover, through an interior of the additional cover and into an interior of the frame cover, wherein the additional cover comprises:
first and second portions having first and second main sections, respectively, and first and second flanges, respectively; and
first and second sidewalls extending between corresponding sidelong edges of at least the first and second main sections,
the first and second portions and the first and second sidewalls being arranged to define a flow passage with an inlet fluidly communicative with the upper passage at an upper end thereof and an outlet at a lower end thereof, and
the first and second flanges being provided at the inlet and outlet, respectively, to prevent fluid flow through the flow passage, and
wherein:
respective upper edges of the first and second portions and the first and second sidewalls form the inlet and the first flange extends from the upper edge of the first portion and forms an acute angle with the first portion at the inlet, and
a lower edge of the second portion terminates above a lower edge of the first portion, the second flange extends from the lower edge of the second portion and forms an obtuse angle with the second portion above the outlet, and respective lower edges of the first portion, the second flange and the first and second sidewalls form the outlet.

8. The electric cabinet according to claim 7, further comprising filter media disposable in the opening.

9. The electric cabinet according to claim 7, wherein respective upper edges of the first and second portions and the first and second sidewalls are registerable with the lower end of the frame cover.

10. The electric cabinet according to claim 9, wherein the respective upper edges are formed to encompass the lower end of the frame cover.

11. The electric cabinet according to claim 7, wherein respective interior edges of the first and second flanges do not overlap across the flow passage.

12. The electric cabinet according to claim 7, wherein the first and second sidewalls taper inwardly while extending from the first portion to the second portion.

13. The electric cabinet according to claim 7, further comprising at least one of a mounting surface and a weld coupled to the first portion by which the additional cover is affixable to the exterior wall.

14. An electric cabinet, comprising:
an exterior wall defining an opening;
a frame cover disposed about the opening to define an upper passage and to direct fluid flow moving through the opening downward through the upper passage; and
an additional cover for providing at least one of NEMA4 and IPX6 protection, which is attachable to a lower end of the frame cover,
the additional cover being formed to define a flow passage fluidly communicative with the upper passage and being configured to form a tortuous path for fluid propagating from an exterior of the additional cover, through the flow passage and toward the upper passage, wherein the additional cover comprises:
first and second portions having first and second main sections, respectively, and first and second flanges, respectively; and
first and second sidewalls extending between corresponding sidelong edges of at least the first and second main sections,
the first and second portions and the first and second sidewalls being arranged to define a flow passage with an inlet fluidly communicative with the upper passage at an upper end thereof and an outlet at a lower end thereof, and
the first and second flanges being provided at the inlet and outlet, respectively, to prevent fluid flow through the flow passage, and
wherein:
respective upper edges of the first and second portions and the first and second sidewalls form the inlet and the first flange extends from the upper edge of the first portion and forms an acute angle with the first portion at the inlet, and
a lower edge of the second portion terminates above a lower edge of the first portion, the second flange extends from the lower edge of the second portion and forms an obtuse angle with the second portion above the outlet, and respective lower edges of the first portion, the second flange and the first and second sidewalls form the outlet.

15. The electric cabinet according to claim 14, further comprising filter media disposable in the opening.

* * * * *